United States Patent
Dimberg et al.

(10) Patent No.: US 10,939,534 B2
(45) Date of Patent: Mar. 2, 2021

(54) CONTROL DEVICE FOR CONTROLLING MULTIPLE OPERATING CHARACTERISTICS OF AN ELECTRICAL LOAD

(71) Applicant: Lutron Technology Company LLC, Coopersburg, PA (US)

(72) Inventors: Chris Dimberg, Easton, PA (US); Thomas M. Shearer, Macungie, PA (US); Daniel L. Twaddell, Bethlehem, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 16/510,398

(22) Filed: Jul. 12, 2019

(65) Prior Publication Data
US 2019/0342984 A1    Nov. 7, 2019

Related U.S. Application Data

(63) Continuation of application No. 15/611,946, filed on Jun. 2, 2017, now Pat. No. 10,375,803.
(Continued)

(51) Int. Cl.
*H05B 37/02* (2006.01)
*G06F 3/0484* (2013.01)
(Continued)

(52) U.S. Cl.
CPC ............ *H05B 47/19* (2020.01); *G05B 15/02* (2013.01); *G05G 1/105* (2013.01); *H01H 19/14* (2013.01);
(Continued)

(58) Field of Classification Search
CPC .... H05B 37/0272; G05B 15/02; H01H 19/14; H01H 23/14; H02J 3/00
(Continued)

(56) References Cited

U.S. PATENT DOCUMENTS

| 5,264,761 A | 11/1993 | Johnson |
| 7,242,150 B2 | 7/2007 | DeJonge et al. |

(Continued)

FOREIGN PATENT DOCUMENTS

| CN | 2596671 Y | 12/2003 |
| CN | 101347050 | 1/2009 |

(Continued)

OTHER PUBLICATIONS

CN 203491988 U, Cited in Official Action dated Sep. 4, 2019 in related Chinese patent application No. 201780044371.1. Machine translation included.
Related Chinese patent application No. 201780044371.1. Machine translation included.

*Primary Examiner* — Brandon S Cole
(74) *Attorney, Agent, or Firm* — Flaster Greenberg P.C.

(57) ABSTRACT

A load control device may be configured to control multiple characteristics of one or more electrical loads such as the intensity and color of a lighting load. The load control device may include concentric rotating portions for adjusting the multiple characteristics. A control circuit of the load control device may be configured to generate control data for controlling one or more of the characteristics of the electrical loads in response to rotations of the concentric rotating portions. The control circuit may be further configured to provide feedback regarding the control being applied on one or more visual indicators. The load control device may be a wall-mounted dimmer device or a battery-powered remote control device.

20 Claims, 6 Drawing Sheets

Related U.S. Application Data

(60) Provisional application No. 62/356,288, filed on Jun. 29, 2016, provisional application No. 62/345,449, filed on Jun. 3, 2016.

(51) Int. Cl.
| | | |
|---|---|---|
| *H01K 1/00* | (2006.01) | |
| *F21K 99/00* | (2016.01) | |
| *E06B 9/80* | (2006.01) | |
| *H05B 47/19* | (2020.01) | |
| *H05B 45/20* | (2020.01) | |
| *H05B 45/24* | (2020.01) | |
| *H05B 47/175* | (2020.01) | |
| *G05B 15/02* | (2006.01) | |
| *H01H 19/14* | (2006.01) | |
| *H01H 23/14* | (2006.01) | |
| *H02J 3/00* | (2006.01) | |
| *G05G 1/10* | (2006.01) | |
| *H01H 19/54* | (2006.01) | |
| *H03K 17/96* | (2006.01) | |
| *H02J 7/00* | (2006.01) | |
| *H01H 19/02* | (2006.01) | |
| *G05G 1/08* | (2006.01) | |

(52) U.S. Cl.
CPC ............ *H01H 19/54* (2013.01); *H01H 23/14* (2013.01); *H02J 3/00* (2013.01); *H02J 7/0047* (2013.01); *H02J 7/0063* (2013.01); *H03K 17/962* (2013.01); *H05B 45/20* (2020.01); *H05B 45/24* (2020.01); *H05B 47/175* (2020.01); *G05B 2219/2614* (2013.01); *G05G 1/08* (2013.01); *H01H 19/025* (2013.01); *H01H 2300/03* (2013.01); *Y02B 90/20* (2013.01); *Y04S 20/14* (2013.01)

(58) Field of Classification Search
USPC ........................... 700/286–298; 315/246–287
See application file for complete search history.

(56) References Cited

U.S. PATENT DOCUMENTS

| | | |
|---|---|---|
| 7,546,473 B2 | 6/2009 | Newman |
| 7,573,208 B2 | 8/2009 | Newman, Jr. |
| 8,167,457 B1 | 5/2012 | Collias et al. |
| 8,330,638 B2 | 12/2012 | Altonen et al. |
| 8,664,881 B2 | 3/2014 | Newman, Jr. et al. |
| 9,112,466 B1 | 8/2015 | Koh et al. |
| 9,208,965 B2 | 12/2015 | Busby et al. |
| 9,418,802 B2 | 8/2016 | Romano et al. |
| 9,520,247 B1 | 12/2016 | Finnegan et al. |
| 9,583,288 B2 | 2/2017 | Jones et al. |
| 9,746,138 B1 | 8/2017 | Thomas |
| 9,799,469 B2 | 10/2017 | Bailey et al. |
| 9,959,997 B2 | 5/2018 | Bailey et al. |
| 2003/0230982 A1* | 12/2003 | Pagano ................. H05B 39/08 315/56 |
| 2008/0111491 A1 | 5/2008 | Spira |
| 2008/0315798 A1 | 12/2008 | Diederiks et al. |
| 2009/0206769 A1 | 8/2009 | Biery et al. |
| 2009/0256483 A1 | 10/2009 | Gehman et al. |
| 2010/0084996 A1* | 4/2010 | Van De Sluis .... H05B 33/0863 315/312 |
| 2013/0099011 A1 | 4/2013 | Matsuoka et al. |
| 2013/0338839 A1 | 12/2013 | Rogers et al. |
| 2014/0266669 A1 | 9/2014 | Fadell et al. |
| 2015/0077021 A1 | 3/2015 | Smith et al. |
| 2015/0294816 A1 | 10/2015 | Jones et al. |
| 2015/0371534 A1 | 12/2015 | Dimberg et al. |
| 2016/0007431 A1* | 1/2016 | Bosua ................. H05B 37/0272 315/158 |
| 2016/0073479 A1 | 3/2016 | Erchak et al. |
| 2017/0105176 A1 | 4/2017 | Finnegan et al. |
| 2017/0226799 A1 | 8/2017 | Hebeisen et al. |
| 2018/0190451 A1 | 7/2018 | Scruggs |

FOREIGN PATENT DOCUMENTS

| | | |
|---|---|---|
| CN | 203491988 U | 3/2014 |
| WO | WO 2007/072316 A2 | 6/2007 |
| WO | WO 2014-066269 A1 | 5/2014 |

* cited by examiner

CONTROL DEVICE FOR CONTROLLING MULTIPLE OPERATING CHARACTERISTICS OF AN ELECTRICAL LOAD

CROSS-REFERENCE TO RELATED APPLICATIONS

This application is a continuation of U.S. patent application Ser. No. 15/611,946, filed Jun. 2, 2017, which claims the benefit of Provisional U.S. Patent Application No. 62/345,449, filed Jun. 3, 2016, and Provisional U.S. Patent Application No. 62/356,288, filed Jun. 29, 2016, the disclosures of which are incorporated herein by reference in their entireties.

BACKGROUND

The intensity and/or color of a lighting fixture may be manipulated for a variety of purposes such as presentation, comfort, and well-being. Typical color control techniques may include dim to warm, correlated color temperature (CCT), and full color tuning. Dim to warm is a technique for adjusting the color temperature of a light source in proportion to the intensity so as to mimic the color shift of incandescent lamps with respect to intensity (e.g., warmer color temperature at lower light levels and cooler color temperature at higher light levels). CCT-based color tuning is a technique for controlling the color temperature and intensity of a light source independently within specified parameters. Full color tuning is a technique for changing the emitted color spectrum of a light source by mixing several base colors (e.g., red, green, blue) in different proportions.

Different types of intensity control/color tuning techniques may require different types of user interfaces. Dim to warm color control, for example, generally requires one control input. The input may be translated (e.g., by an LED driver) into an appropriate intensity and/or color control signal for driving the lighting fixture. CCT-based color tuning and/or full color control may require one control input for color temperature and a separate control input for light intensity. Further, a user may desire to not only apply the aforementioned types of control, but also receive feedback about the type, amount and/or result of the control being applied.

A traditional control device is usually designed to control one specific aspect of an electrical load. For example, a dimmer switch may be only capable of controlling the intensity of a lighting load. To control the color of the lighting load, a separate control device is often required. Using multiple control devices to control an electrical load not only increases the cost and amount of work required to set up the concerned load control system, but also negatively affects the usability and aesthetic appeal of the system. Traditional control devices also have very simplistic user interfaces that lack a feedback mechanism for keeping a user informed about the type and/or amount of control being applied.

SUMMARY

As described herein, a control device may be configured for use in a load control system to control respective amount of power delivered to one or more electrical loads. The control device may be external to the one or more electrical loads, and may include a base portion configured to be mounted to an electrical wallbox (e.g., when the control device is a dimmer switch) or over an existing mechanical switch (e.g., when the control device is a retrofit remote control device). When configured as a dimmer device, the control device may further include a load control circuit adapted to be electrically coupled in series between an AC power source and the one or more electrical loads for controlling power delivered to the one or more electrical loads. When configured as a retrofit remote control device, the control device may be mounted over a toggle actuator of a mechanical switch that controls whether power is delivered to the one or more electrical loads.

The control device may further include first and second concentric rotating portions and a control circuit. The first and second rotating portions may occupy different planes along an axis perpendicular to the base portion. The first and second rotating portions may be independently and simultaneously rotatable with respect to the base portion for adjusting a first characteristic (e.g., such as an intensity) and a second characteristic (e.g., such as a color) of the one or more electrical loads. The control circuit may be configured to generate first control data for changing the first characteristic of the one or more electrical loads in response to rotations of the first rotating portion, and generate second control data for changing the second characteristic of the one or more electrical loads in response to rotations of the second rotating portion.

The control device may further include one or more visual indicators configured to be illuminated by one or more light sources. The one or more visual indicators may form a substantially circular light bar that may extend along a perimeter of the first rotating portion. When illuminated, the light bar may provide feedback about the first and/or second characteristics of the one or more electrical loads.

DETAILED DESCRIPTION

Figure 1:
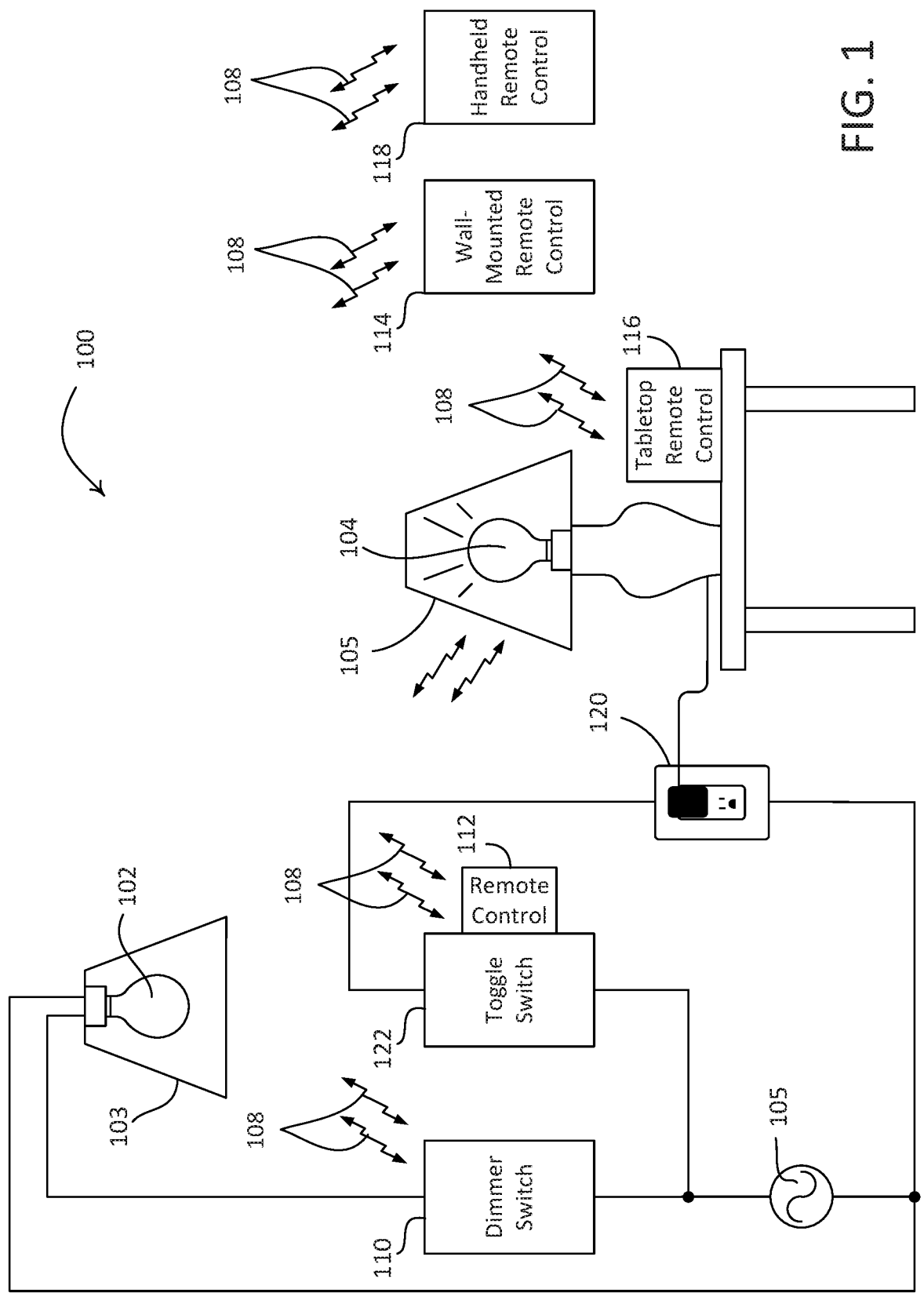
FIG. 1 depicts an example load control system that includes one or more example control devices.

FIG. 1 is a simplified diagram of an example load control system. As shown, the load control system is configured as a lighting control system 100 for control of one or more lighting loads, such as a lighting load 102 that is installed in a ceiling-mounted downlight fixture 103 and a controllable lighting load 104 that is installed in a table lamp 105. The lighting loads 102, 104 shown in FIG. 1 may include light sources of different types (e.g., incandescent lamps, fluorescent lamps, and/or LED light sources). The lighting loads may have advanced features. For example, the lighting loads may be controlled to emit light of varying intensities and/or colors in response to a user command. The amount of power delivered to the lighting loads may be adjusted to an absolute level or by a relative amount. The lighting control system 100 may be configured to control one or more of the lighting loads (e.g., and/or other electrical loads) according to one or more configurable presets or scenes. These presets or scenes may correspond to, for example, predefined light intensities and/or colors, predefined entertainment settings such as music selection and/or volume settings, predefined window treatment settings such as positions of shades, predefined environmental settings such as HVAC settings, or any combination thereof. The presets or scenes may correspond to one or more specific electrical loads (e.g., bedside lamps, ceiling lights, etc.) and/or one or more specific locations (e.g., a room, an entire house, etc.).

The lighting load 102 may be an example of a lighting load that is wired into a power control and/or delivery path of the lighting control system 100. As such, the lighting load 102 may be controllable by a wall-mounted control device such as a dimmer switch. The lighting load 104 may be an example of a lighting load that is equipped with integral load control circuitry and/or wireless communication capabilities such that the lighting load may be controlled via a wireless control mechanism (e.g., by a remote control device).

The lighting control system 100 may include one or more control devices for controlling the lighting loads 102, 104 (e.g., controlling an amount of power delivered to the lighting loads). The lighting loads 102, 104 may be controlled substantially in unison, or be controlled individually. For example, the lighting loads may be zoned so that the lighting load 102 may be controlled by a first control device, while the lighting load 104 may be controlled by a second control device. The control devices may be configured to turn the lighting loads 102, 104 on and off. The control devices may be configured to control the magnitude of a load current conducted through the lighting loads (e.g., so as to control an intensity of the lighting loads 102, 104 between a low-end intensity $L_{LE}$ and a high-end intensity $L_{HE}$). The control devices may be configured to control an amount of power delivered to the lighting loads to an absolute level (e.g., to a maximum allowable amount), or by a relative amount (e.g., an increase of 10% from a current level). The control devices may be configured to control a color of the lighting load 102, 104 (e.g., by controlling a color temperature of the lighting loads or by applying full color control over the lighting loads).

The control devices may be configured to activate a preset associated with the lighting load 102, 104 (e.g., a preset may be associated with one or more predetermined settings of the lighting loads such as an intensity level of the lighting loads and/or a color of the lighting loads). The presets may be configured via the control device and/or via an external device (e.g., a mobile device) by way of a wireless communication circuit of the control device. The control devices may be configured to activate control of a zone. A zone may correspond to one or more electrical loads that are configured to be controlled by the control devices. A zone may be associated with a specific location (e.g., a living room) or multiple locations (e.g., an entire house with multiple rooms and hallways). The control devices may be configured to switch between different operational modes. An operational mode may be associated with controlling different types of electrical loads or different operational aspects of one or more electrical loads. Examples of operational modes may include a lighting control mode for controlling one or more lighting loads (e.g., which in turn may include a color control mode and an intensity control mode), an entertainment system control mode (e.g., for controlling music selection and/or the volume of an audio system), an HVAC system control mode, a window treatment device control mode (e.g., for controlling one or more shades), and/or the like.

The control device described herein may be, for example, a dimmer switch 110, a retrofit remote control device 112, a wall-mounted control device 114, a tabletop remote control device 116, and/or a handheld remote control device 118, as shown in FIG. 1. The dimmer switch 110 may include a base portion (e.g., such as one or more of a yoke, a bezel, and an enclosure that may house electrical circuitry and/or mechanical complements of the dimmer switch 110) that is configured to be mounted to a standard electrical wallbox. Once mounted, the dimmer switch 110 may be coupled in series electrical connection between an alternating-current (AC) power source 105 and a lighting load that is wired into the control path of the dimmer switch 110 (e.g., such as the lighting load 102). The dimmer switch 110 may receive an AC mains line voltage $V_{AC}$ from the AC power source 105, and may generate a control signal for controlling the lighting load 102. The control signal may be generated via various phase-control techniques (e.g., a forward phase-control dimming technique or a reverse phase-control dimming technique). The dimmer switch 110 may be configured to receive wireless signals (e.g., from a remote control device) representative of commands to control the lighting load 102, and generate respective control signals for executing the commands. Examples of wall-mounted dimmer switches are described in greater detail with reference to FIG. 13, and in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSOR-CONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are hereby incorporated by reference.

The retrofit remote control device 112 may include a base portion configured to be mounted to a mechanical switch (e.g., a toggle switch 122, a paddle switch, a pushbutton switch, and/or other suitable switch) that may be pre-existing in the lighting control system 100. Such a retrofit solution may provide energy savings and/or advanced control features, for example without requiring significant electrical re-wiring and/or without requiring the replacement of existing mechanical switches. As an example, a consumer may replace an existing lamp with the controllable lighting load 104, switch a toggle switch 122 that is coupled to the lighting load 104 to the on position, install (e.g., mount) the remote control device 112 onto the toggle switch 122, and associate the remote control device 112 with the lighting source 104. The retrofit remoted control 112 may then be used to perform advanced functions that the toggle switch 122 may be incapable of performing (e.g., such as dimming the intensity level of the light output, changing the color of the light output, providing feedback to a user, etc.). As shown, the toggle switch 122 is coupled (e.g., via a series electrical connection) between the AC power source 105 and an electrical receptacle 120 into which the lighting load 104 may be plugged (e.g., as shown in FIG. 1). Alternative, the toggle switch 122 may be coupled between the AC power source 105 and one or more of the lighting loads 102, 104, without the electrical receptacle 120.

The wall-mounted remote control device 114 may be configured to be mounted to a standard electrical wallbox and be electrically connected to the AC power source 105 for receiving power. The wall-mounted remote control device 114 may be configured to receive a user input and may generate and transmit a control signal (e.g., control data such as a digital message) for controlling the lighting loads 102, 104 in response to the user input. The tabletop remote control device 116 may be configured to be placed on a surface (e.g., an end table or night stand), and may be powered by a direct-current (DC) power source (e.g., a battery or an external DC power supply plugged into an electrical outlet). The tabletop remote control device 116 may be configured to receive a user input, and may generate and transmit a signal (e.g., a digital message) for controlling the lighting loads 102, 104 in response to the user input. The handheld remote control device 118 may be sized to fit into a user's hand, and may be powered by a direct-current (DC) power source (e.g., a battery or an external DC power supply plugged into an electrical outlet). The handheld remote control device 118 may be configured to receive a user input, and may generate and transmit a signal (e.g., a digital message) for controlling the lighting loads 102, 104 in response to the user input. Examples of battery-powered remote controls are described in greater detail in commonly assigned U.S. Pat. No. 8,330,638, issued Dec. 11, 2012, entitled WIRELESS BATTERY POWERED REMOTE CONTROL HAVING MULTIPLE MOUNTING MEANS, and U.S. Pat. No. 7,573,208, issued Aug. 11, 2009, entitled METHOD OF PROGRAMMING A LIGHTING PRESET FROM A RADIO-FREQUENCY REMOTE CONTROL, the entire disclosures of which are hereby incorporated by reference.

The control devices described herein (e.g., the dimmer switch 110 and/or remote control devices 112-118) may each include a user input unit. The user input unit may be configured to receive (e.g., detect) user inputs for controlling one or more of the lighting loads 102, 104, and/or the control device itself. A plurality of mechanisms for receiving the user inputs may be implemented on the user input unit, including, for example, a rotating mechanism (e.g., such as a rotary knob or a dial), a button or switch or an imitation thereof, and a touch sensitive device (e.g., such as a capacitive touch surface) configured to detect both point actuations and gestures.

The control devices described herein (e.g., the dimmer switch 110 and/or remote control devices 112-118) may each include one or more visual indicators (e.g., a light bar) configured to be illuminated by one or more light sources (e.g., one or more LEDs). The one or more visual indicators may be provided on the user input unit or may be separate from the user input unit. The one or more visual indicators may be operable to provide feedback to a user of the control device. Such feedback may indicate, for example, a status of a lighting load (e.g., the lighting loads 102, 104) controlled by the control device. The status may reflect, for example, whether the lighting load is on or off, a present intensity of the lighting load, a color of the lighting load, and so on. The feedback may indicate a status of the control device itself, for example, such as a present operational mode of the control device (e.g., an intensity control mode or a color control mode), a power status of the control device (e.g., remaining battery power), and so on. As an example, the control device may provide feedback via the visual indicators while the control device is being actuated and/or after the control device is actuated. The feedback may indicate to the user that the control device is transmitting control signals (e.g., RF signals) in response to the actuation. The control device may be configured to keep the visual indicators illuminated while the condition triggering the feedback continues to exist. The control device may be configured to illuminate the visual indicators for a few seconds (e.g., 1-2 seconds) and then turn off the visual indicators (e.g., to conserve battery life).

The control devices described herein (e.g., the dimmer switch 110 and/or remote control devices 112-118) may each include a control circuit. The control circuit may be configured to be responsive to a user input received via the user input unit. The control circuit may be configured to generate control data (e.g., a control signal) for controlling the lighting loads 102, 104 in response to the user input. The control data may include commands and/or other information (e.g., device identification information) for controlling the lighting loads 102, 104. The control data may be included in a control signal transmitted to the lighting loads 102, 104 via a wireless communication circuit. The control circuit may be configured to illuminate the one or more visual indicators to provide feedback of the control being applied and/or its outcome.

The control devices described herein (e.g., the dimmer switch 110 and/or remote control devices 112-118) may each include a wireless communication circuit for transmitting and/or receiving radio frequency (RF) signals 108. The wireless communication circuit may be used to transmit a control signal that includes the control data (e.g., a digital message) generated by the control device to the lighting loads 102, 104 or to a central controller of the lighting control system 100, for example. The control data may be generated in response to a user input to adjust one or more operational aspects of the lighting loads 102, 104. The control data may include a command and/or identification information (e.g., such as a unique identifier) associated with the control device and/or one or more of the lighting loads 102, 104 (e.g., and/or other electrical loads of the load control system 100).

The control devices (e.g., the remote control devices 112-118) may be associated with one or more lighting loads and/or other control devices (e.g., the dimmer switch 110) for controlling the lighting loads (e.g., through a configuration procedure). Upon such association, the lighting loads 102, 104 may be responsive to control signals transmitted by the control devices. To illustrate, the association may be accomplished by actuating an actuator on the concerned lighting loads and/or control devices, and then actuating (e.g., pressing and holding) an actuator on the control device for a predetermined amount of time (e.g., approximately 10 seconds). Examples of a configuration procedure for associating a control device with an electrical load is described in greater detail in commonly-assigned U.S. Patent Publication No. 2008/0111491, published May 15, 2008, entitled RADIO-FREQUENCY LIGHTING CONTROL SYSTEM, the entire disclosure of which is hereby incorporated by reference. The wireless communication circuit may also be controlled to transmit/receive feedback information regarding the control device and/or the lighting loads 102, 104 via RF signals.

The control device described herein (e.g., the dimmer switch 110 and/or remote control devices 112-118) may include a memory (not shown). The memory may be used, for example, to store operational settings associated with the control device and/or the lighting loads 102, 104 (e.g., such as lighting presets and their associated light intensities and/or colors). The memory may be implemented as an external integrated circuit (IC) or as an internal circuit (e.g., as part of a control circuit).

Further, it should be appreciated that, although a lighting control system with two lighting loads is provided as an example above, a load control system as described herein may include more or fewer lighting loads, other types of lighting loads, and/or other types of electrical loads that may be configured to be controlled by the one or more control devices. For example, the load control system may include one or more of: a dimming ballast for driving a gas-discharge lamp; an LED driver for driving an LED light source; a dimming circuit for controlling the intensity of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a set-point temperature of a heating, ventilation, and air-conditioning (HVAC) system; an air conditioner; a compressor; an electric baseboard heater controller; a controllable damper; a variable air volume controller; a fresh air intake controller; a ventilation controller; one or more hydraulic valves for use in radiators and radiant heating system; a humidity control unit; a humidifier; a dehumidifier; a water heater; a boiler controller; a pool pump; a refrigerator; a freezer; a television and/or computer monitor; a video camera; an audio system or amplifier; an elevator; a power supply; a generator; an electric charger, such as an electric vehicle charger; an alternative energy controller; and/or the like.

Figure 2:
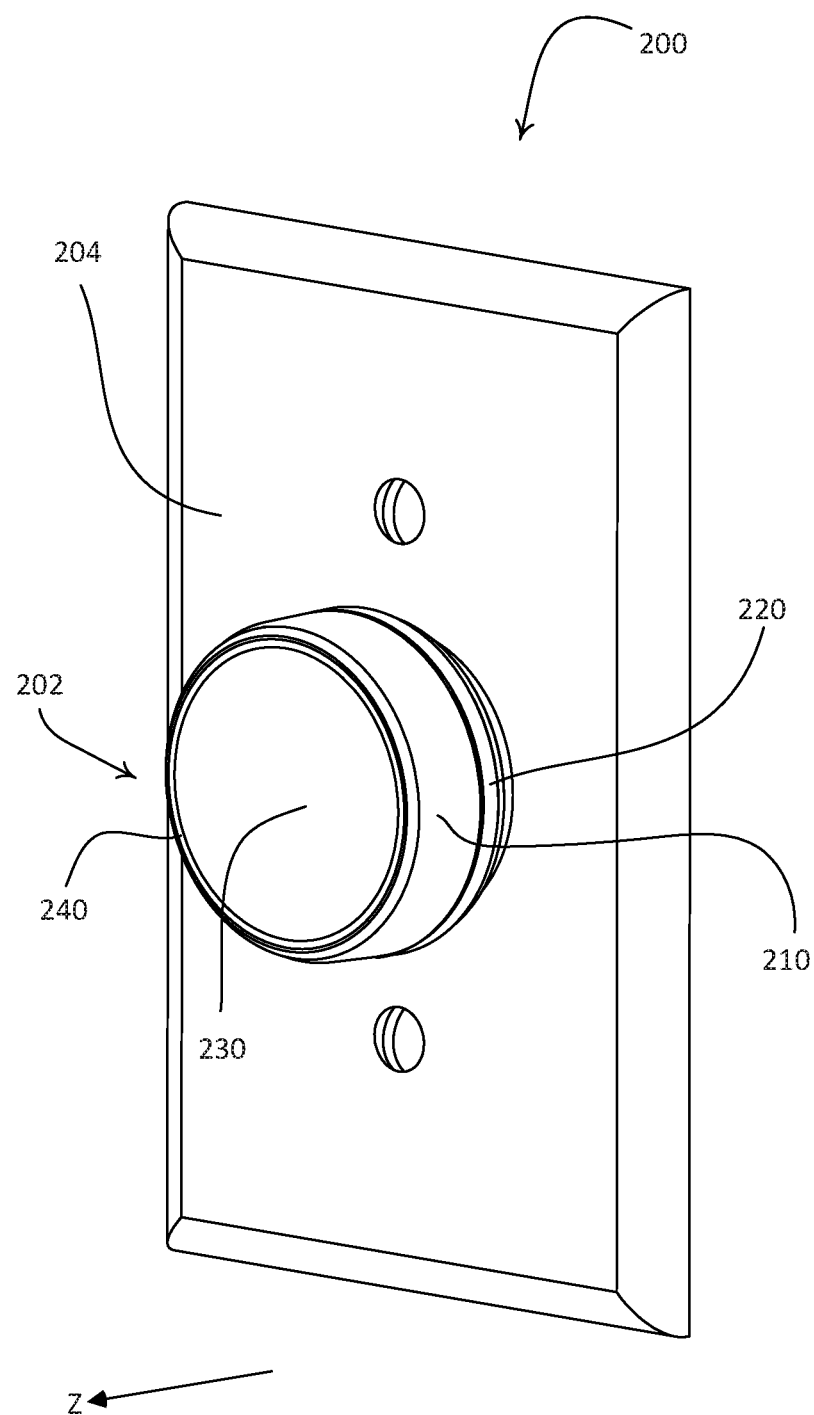
FIG. 2 is a perspective view of an example control device that may be deployed as a dimmer switch and/or a remote control device of the load control system illustrated in FIG. 1.

FIG. 2 depicts an example control device 200 that may be deployed as the dimmer switch 110 and/or the retrofit remote control device 112 in the lighting control system 100. The lighting control system 100 may include one or more lighting loads, such as the lighting loads 102, 104. The control device 200 may comprise a user interface 202 (e.g., a user input device) and a faceplate 204. The user interface 202 may include first and second rotating portions 210, 220 that may be independently and/or simultaneously rotatable with respect to a base portion of the control device 200 and/or the faceplate 204 for controlling multiple characteristics (e.g., two different operating characteristics) of the one or more lighting loads (e.g., as will be described in greater detail below). The user interface 202 may also include an actuation portion 230 that may be pressed in towards the faceplate 204 for turning the lighting loads on and off (e.g., toggling the lighting loads).

The first and second rotating portions 210, 220 may be configured as concentric rings on the control device 200. For example, the first and second rotating portions may have the same center point or the center points of the first and second rotating portions may be aligned (e.g., along the Z-direction shown in FIG. 2). The first rotating portion 210 may be arranged as a front ring (e.g., farther away from the faceplate 214 in the Z-direction than the second rotation portion 220). The second rotating portion 220 may be arranged as a rear ring (e.g., closer to the faceplate 214 in the Z-direction than the first rotation portion 210). As shown in FIG. 2, the first and second rotating portions 210, 220 may have approximately the same outer diameter. Alternatively, the first and second rotating portions 210, 220 may have different outer diameters. For example, the second rotating portion 220 may have a larger outer diameter than the first rotating portion 210.

The control device 200 may be responsive to rotations of either the first or the second rotating portion 210, 220. For example, the control device 200 (e.g., the control circuit included therein) may, in response to the first rotating portion 210 being rotated with respect to the faceplate 204, generate first control data for adjusting the amount of power delivered to the lighting loads controlled by the control device. The control device 200 (e.g., the control circuit included therein) may, in response to the second rotating portion 220 being rotated with respect to the faceplate 204, generate second control data for adjusting the color (e.g., the color temperature) of the lighting loads controlled by the control device. Slow rotations of the second rotating portion 220 may provide fine tune adjustments of the color of the lighting loads, while fast rotations of the second rotating portion 210 may provide gross adjustments of the color of the lighting loads.

The control device 200 may also be responsive to simultaneous rotations of the first and second rotating portions 210, 220 (e.g., the first and second rotating portions 210, 220 may be rotated at the same time). For example, the control device 200 may be configured to control the intensity and the color of the controlled lighting loads according to a predetermined (e.g., stored) dimming curve. The predetermined dimming curve may be stored in memory in the control device 200. The predetermined dimming curve may be, for example, a dim-to-warm dimming curve that defines a relationship between the intensity and the color (e.g., color temperature) of the lighting loads, e.g., how both the intensity and the color of the lighting loads may be controlled to simulate the intensity and color of an incandescent lamp (e.g., a black body radiator) when dimmed. Based on the dim-to-warm dimming curve, the control circuit may determine how the color of the lighting loads may be controlled with respect to the intensity of the lighting loads, where the intensity of the lighting loads may be dependent upon the position of the first and second rotating portion 210, 220. The control circuit may thus control the lighting loads to simulate the intensity and color of an incandescent lamp (e.g., a black body radiator) when dimmed.

For example, the user may grasp and rotate both of the first and second rotating portions 210, 220 to control both the intensity and the color of the controlled lighting loads according to the predetermined dimming curve. In addition, the first and second rotating portions 210, 220 may be locked together to allow for control of both the intensity and the color of the controlled lighting loads according to the predetermined dimming curve. For example, the first and second rotating portions 210, 220 may be pushed together and/or pulled apart to lock and/or unlock the first and second rotating portions. In addition, the control device 200 may comprise a locking member (not shown) that may be slid or snapped into place to lock the first and second rotating portions 210, 220 together. Using any of the foregoing mechanisms, the user may set a position of the first and second rotating portion 210, 220. In response, the control circuit of the control device 200 may generate, based on the predetermined dimming curve, first control data for adjusting the intensity of the controlled lighting loads and second control data for adjusting the color of the controlled lighting loads. The control circuit may then cause a communication circuit to transmit the first and second control data (e.g., transmit one or more control signals including the first and second control data) to the controlled lighting loads or a central controller, e.g., as will be discussed in greater detail below. Alternatively, the control circuit may be configured to generate combined intensity and color control data (e.g., third control data) in response to simultaneous rotations of the first and second rotating portion, and cause the combined control data to be transmitted via the communication circuit to the controlled lighting loads or the central controller.

Although described with reference to color and intensity, the control device 200 may generate control signals for adjusting any type of characteristic of an electrical load in response to rotations of one or more of the first and second rotating portions 210, 220. For example, the characteristics may be any of intensity, color (e.g., color temperature), volume, music selection, HVAC mode (e.g., AC on/off, heat on/off, temperature, fan speed, etc.), ceiling fan speed, relative height/location of a motorized window treatment, or any of adjustable characteristics of the electrical loads described herein. Further, although described with reference to controlling a single electrical load, the control device 200 may be configured to control a characteristic of one or more electricals load in response to rotations of the first rotating portion 210, and control another potentially different characteristic of one or more potentially different electrical loads in response to rotations of the second rotating portion 220 (e.g., and a third characteristic of one or more potentially different electrical loads in response to simultaneous rotations of the first and second rotating portions 210, 220).

The user interface 202 may also include one or more visual indicators configured to be illuminated by one or more light sources (e.g., one or more LEDs) to visibly display information. For example, the user interface 202 may include a light bar 240. When a user is rotating the first rotating portion 210, the light bar 240 may be illuminated (e.g., illuminated in a single color, such as white) to display feedback information regarding the present intensity of one or more of the lighting loads. When a user is rotating the second rotating portion 220, the light bar 240 may be illuminated with one or more colors to provide feedback of the present color of one or more of the lighting loads. For example, the entire light bar 240 may be illuminated a single color to provide feedback of the present color of one or more of the lighting loads and/or the color of the light bar 240 may change as the second rotation portion 220 is rotated. When a user is rotating both the first and second rotating portions 210, 220, the light bar 240 may be illuminated to provide feedback of the present intensity and/or color of one or more of the lighting loads. Additionally or alternatively, the front surface of the actuation portion 230 may be illuminated to provide feedback to a user. For example, the front surface may be illuminated a single color (e.g., from behind by LEDs inside of the control device 200) to provide feedback of the present color of one or more of the lighting loads.

Figure 3:
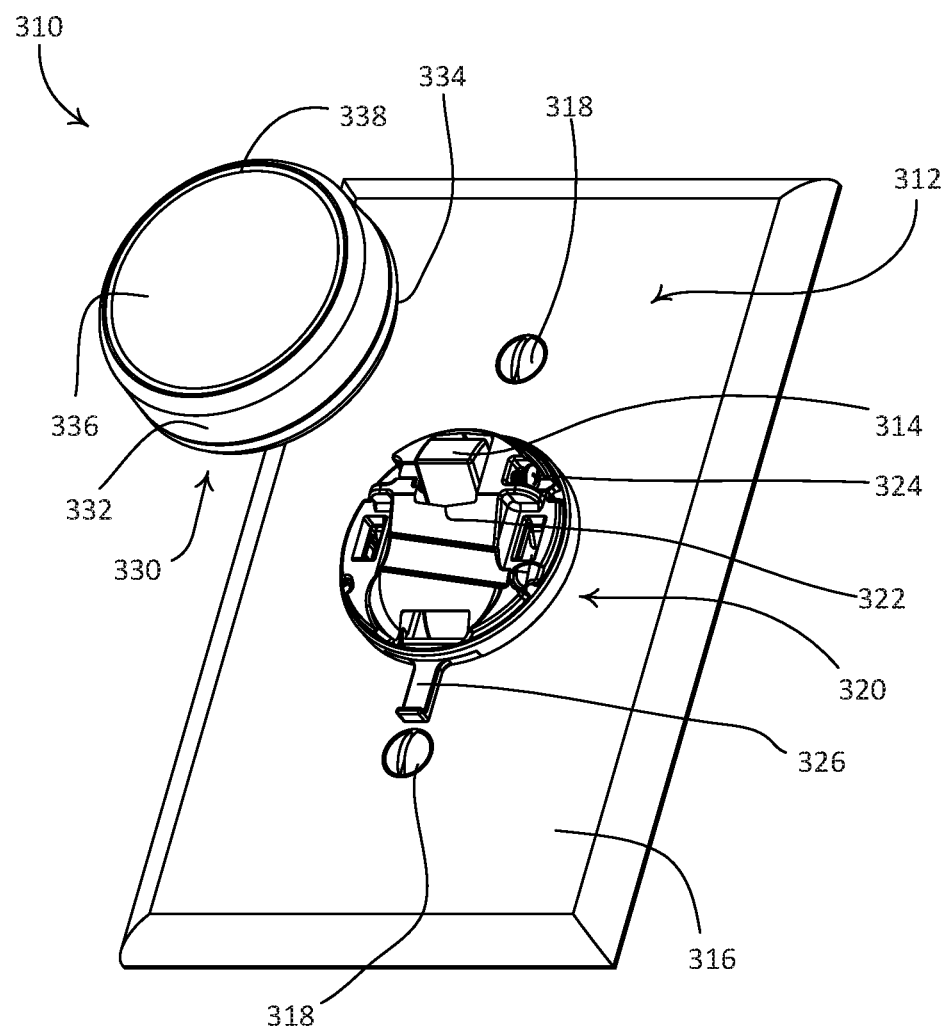
FIG. 3 is an exploded perspective view of an example remote control device that may be deployed as a remote control device of the load control system illustrated in FIG. 1 with a control unit detached from a base portion.

FIG. 3 is a front exploded perspective view of an example remote control device 310 that may be deployed as the retrofit remote control device 112 in the lighting control system 100 shown in FIG. 1 and/or the control device 200 shown in FIG. 2. The remote control device 310 may be configured to be mounted over an actuator of a standard light switch 312 (e.g., a toggle actuator of a single pole single throw (SPST) maintained mechanical switch). The remote control device 310 may be installed over of an existing faceplate 316 that is mounted to the light switch 312 (e.g., via faceplate screws 318). The remote control device 310 may include a base portion 320 and a control unit 330 that may be operably coupled to the base portion 320. The control unit 330 may be supported by the base portion 310 and may include first and second rotating portions 332, 334 (e.g., annular rotating portions) that are rotatable with respect to the base portion 320. The control unit 330 may, for example, be referred to as a control module.

As shown in FIG. 3, the control unit 330 may be detached from the base portion 320. The base portion 320 may be attached (e.g., fixedly attached) to a toggle actuator 314 and may be configured to maintain the toggle actuator 314 in the on position. The toggle actuator 314 may be received through a toggle actuator opening 322 in the base portion 320. A screw 324 may be tightened to attach (e.g., fixedly attached) the base portion 320 to the toggle actuator 314. In this regard, the base portion 320 may be configured to prevent a user from inadvertently switching the toggle actuator 314 to the off position when the remote control device 310 is attached to the light switch 312.

The control unit 330 may be released from the base portion 320. For example, a control unit release tab 326 may be provided on the base portion 320. By actuating the control unit release tab 326 (e.g., pushing up towards the base portion or pulling down away from the base portion), a user may remove the control unit 330 from the base portion 320.

The control unit 330 may comprise one or more clips (not shown) that may be retained by respective locking members (not shown) connected to the control unit release tab 326 when the base portion 320 is in a locked position. The one or more clips may be released from the respective locking members of the base portion 320 when the control unit release tab 326 is actuated (e.g., pushed up towards the base portion or pulled down away from the base portion) to put the base portion 320 in an unlocked position. In an example, the locking members may be spring biased into the locked position and may automatically return to the locked position after the control unit release tab 326 is actuated and released. In an example, the locking members may not be spring biased, in which case the control unit release tab 326 may be actuated to return the base portion 320 to the locked position. The control unit 330 may be released from the base portion 320 to access one or more batteries (not shown) that provides power to at least the remote control device 310.

When the control unit 330 is coupled to the base portion 320, the first and second rotating portions 332, 334 may both be rotatable with respect to the base portion 320 (e.g., in the clockwise and/or counter-clockwise directions). The base portion 320 may be configured to be mounted over the toggle actuator 314 of the switch 312 such that the rotational movement of either or both of the first and second rotating portions 332, 334 may not change the operational state of the toggle actuator 314 (e.g., the toggle actuator 314 may remain in the on position to maintain functionality of the remote control device 310).

The control unit 330 may comprise an actuation portion 336. The actuation portion 336 may in turn comprise a part or an entirety of a front surface of the control unit 330. For example, the control unit 330 may have a circular surface within an opening defined by the first rotating portion 332. The actuation portion 336 may comprise a part of the circular surface (e.g., a central area of the circular surface) or approximately the entire circular surface. In an example, the actuation portion 336 may be configured to move towards the light switch 312 to actuate a switch (not shown) inside the control unit 330 as will be described in greater detail below. The actuation portion 336 may return to an idle position after being actuated.

The remote control device 310 may be configured to transmit one or more wireless communication signals (e.g., the RF signals 108 of FIG. 1) to an electrical load (e.g., the lighting loads 102, 104 of the lighting control system 100 of FIG. 1). The remote control device 310 may include a wireless communication circuit (e.g., an RF transceiver or transmitter (not shown)) via which one or more wireless communication signals may be sent and/or received. The control unit 330 may be configured to transmit digital messages (e.g., including commands to control the controllable electrical load) via the wireless communication signals. For example, the control unit 330 may be configured to transmit, via the wireless communication circuit, a command to raise the intensity of a controllable lighting load in response to a clockwise rotation of the first rotating portion 332 and to transmit a command to lower the intensity of the controllable light source in response to a counterclockwise rotation of the first rotating portion 332. In addition, the control unit 330 may be configured to transmit, via the wireless communication circuit, a command to adjust the color (e.g., the color temperature) of the controllable lighting load in response to clockwise and counterclockwise rotations of the second rotating portion 334.

Although described with reference to color and intensity, the control unit 330 may generate control signals for adjusting any type of characteristic of an electrical load in response to rotations of one or more of the first and second rotating portions 332, 334. For example, the characteristics may be any of intensity, color (e.g., color temperature), volume, music selection, HVAC mode (e.g., AC on/off, heat on/off, temperature, fan speed, etc.), ceiling fan speed, relative height/location of a motorized window treatment, or any of adjustable characteristics of the electrical loads described herein. Further, although described with reference to controlling a single electrical load, the control unit 330 may be configured to control a characteristic of one or more electricals load in response to rotations of the first rotating portion 332, and control another potentially different characteristic of one or more potentially different electrical loads in response to rotations of the second rotating portion 334 (e.g., and a third characteristic of one or more potentially different electrical loads in response to simultaneous rotations of the first and second rotating portions 332, 334).

The control unit 330 may be configured to transmit a command to toggle an electrical load (e.g., from off to on or vice versa) in response to an actuation of the actuation portion 336. In addition, the control unit 330 may be configured to transmit a command to turn an electrical load on in response to an actuation of the actuation portion 336 (e.g., if the control unit 330 possesses information indicating that the electrical load is presently off). The control unit 330 may be configured to transmit a command to turn an electrical load off in response to an actuation of the actuation portion 336 (e.g., if the control unit possesses information indicating that the electrical load is presently on).

The control unit 330 may be configured to transmit a command to turn an electrical load on to a maximum power level (e.g., to turn a light source on to full intensity) in response to a double tap of the actuation portion 336 (e.g., two actuations in quick succession). The control unit 330 may be configured to adjust the power level of an electrical load to a minimum level (e.g., to turn the intensity of a lighting load to a minimum intensity) in response to rotation of the first rotating portion 332 and may only turn off the electrical load in response to an actuation of the actuation portion 336. The control unit 330 may also be configured in a spin-to-off mode, in which the control unit 330 may turn off an electrical load after the power level of the electrical load (e.g., intensity of the lighting load) is controlled to a minimum level in response to a rotation of the first rotating portion 332 (e.g., without an actuation of the actuation portion).

The control unit 330 may comprise one or more visual indicators (e.g., a light bar 338) that may be illuminated by one or light sources (e.g., LEDs), for example, to provide feedback to a user of the remoted control device 310. The light bar 338 may be located in different areas of the remote control device 310 in different implementations. For example, the light bar 338 may be located between the first rotating portion 332 and the actuation portion 336, and/or extend along the perimeter of the first rotating portion 332 or the actuation portion 336. The light bar 338 may have different shapes. For example, the light bar 338 may form a full circle (e.g., a substantially full circle) as shown in FIG. 3, a partial circle, a linear light bar, and/or the like. The light bar 338 may be attached to a periphery of the actuation portion 336 and move with the actuation portion 336 (e.g., when the actuation portion is actuated). The light bar 338 may have a certain width (e.g., a same width along the entire length of the light bar). The exact value of the width may vary, for example, depending on the size of the remote control device 310 and/or the intensity of the light source(s) that illuminates the light bar 338.

While the rotating portions 210, 220, 332, 334 and the actuations portions 230, 336 of the control device 200 and the remote control device 310 shown and described herein have a circular shape, the rotating portions and the actuation portions could have other shapes. For example, the rotating portions and the actuation portions may a rectangular shape, a square shape, a diamond shape, a triangular shape, an oval shape, a star shape, or any suitable shape. The front surface of the actuations portions 230, 336 and/or the side surfaces of the rotating portions 210, 220, 332, 334 may be planar or non-planar. In addition, the light bars 240, 338 may have alternative shapes, such as a rectangular shape, a square shape, a diamond shape, a triangular shape, an oval shape, a star shape, or any suitable shape. The light bars 240, 338 may be continuous loops, partial loops, broken loops, a single linear bar, a linear or circular array of visual indicators, and/or other suitable arrangement. The surfaces of the control device 200 and/or the remote control device 300 may be characterized by various colors, finishes, designs, patterns, etc.

Figure 4:
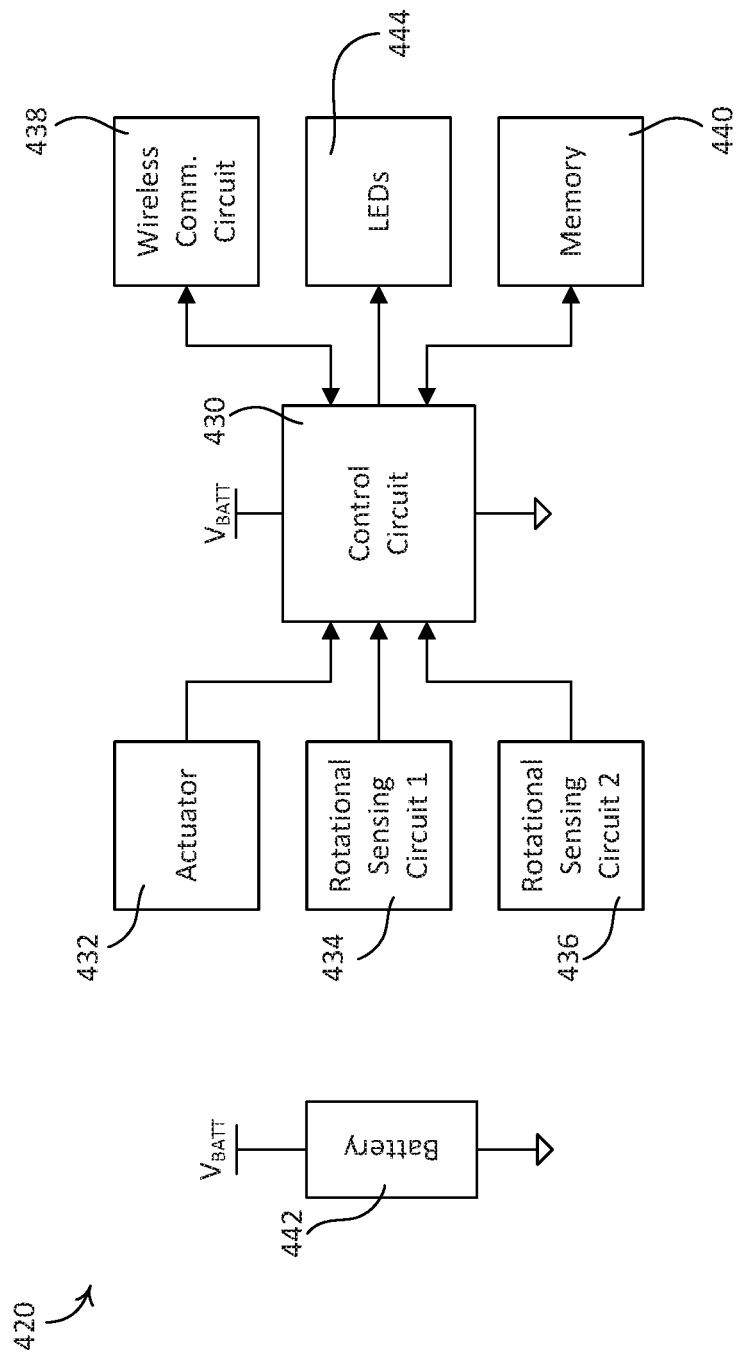
FIG. 4 shows a simplified block diagram of an example control device that may be deployed as a remote control device of the load control system illustrated in FIG. 1.

FIG. 4 is a simplified block diagram of an example control device 400 (e.g., a remote control device), which may be deployed as the remote control devices 112-118 in the lighting control system 100, the control device 200, and/or the remote control device 310. The control device 400 may include a control circuit 430, one or more actuators 432 (e.g., buttons and/or switches), first and second rotational sensing circuits 434, 436, a wireless communication circuit 438, a memory 440, a battery 442, and/or one or more LEDs 444. The memory 440 may be configured to store one or more operating parameters (e.g., such as a preconfigured dimming curve, a preconfigured color scene, and/or a preset light intensity) of the control device 400. The battery 442 may provide power to one or more of the components shown in FIG. 4.

The one or more actuators 432 may include a button or switch (e.g., a mechanical button or switch, or an imitation thereof) such as those described in association with the actuation portion 230 of the control device 200 and/or the actuation portion 336 of the remote control device 310. The actuators 432 may be configured to send respective input signals to the control circuit 430 in response to actuations of the actuators 432. The first and second rotational sensing circuits 434, 436 may be configured to translate forces applied to respective rotating mechanisms (e.g., such as the rotating portions 210, 220 of the control device 200 and/or the rotating portions 332, 334 of the remote control device 310) into one or more input signals and provide the one or more input signals to the control circuit 430. Each of the rotational sensing circuits 434, 436 may include, for example, one or more magnetic sensors (e.g., such as Hall-effect sensors (HES), tunneling magnetoresistance (TMR) sensors, anisotropic magnetoresistance (AMR) sensors, giant magnetoresistance (GMR) sensors, reed switches, or other mechanical magnetic sensors), a mechanical encoder, an optical encoder, and/or a potentiometer (e.g., a polymer thick film or other resistive trace on a printed circuit board).

The control circuit 430 may be configured to translate the input signals provided by the actuators 432, and/or the rotational sensing circuits 434, 436 into control data (e.g., digital control signals) for controlling one or more electrical loads. For example, the control circuit 430 may, in response to input signals provided by the rotational sensing circuit 434, generate first control data for adjusting an intensity of one or more controlled lighting loads. Similarly, the control circuit 430 may, in response to input signals provided by the rotational sensing circuit 436, generate second control data for adjusting a color of the one or more controlled lighting loads. The control circuit 430 may cause the first and/or second control data (e.g., digital control signals) to be transmitted to the electrical loads via the wireless communication circuit 438. For example, the wireless communication circuit 438 may transmit one or more control signals including the first and/or second control data to the one or more electrical loads or to a central controller of the concerned load control system. The control circuit 430 may illuminated the LEDs 444 to present a light bar (e.g., such as the light bar 240 and/or the light bar 338) and/or one or more indicator lights to provide feedback about various conditions.

Figure 5:
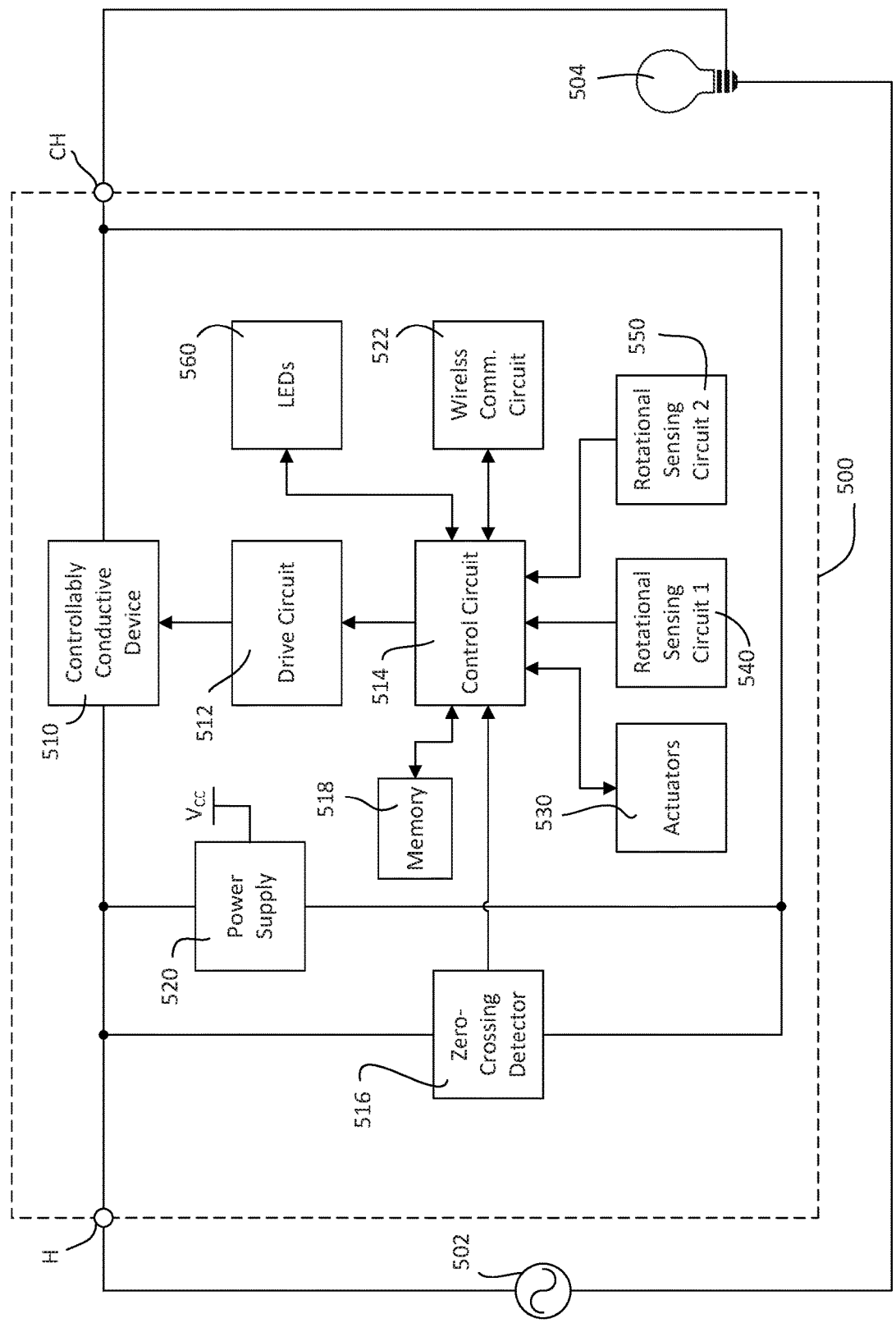
FIG. 5 shows a simplified block diagram of an example control device that may be deployed as a load control device (e.g., a dimmer switch) of the load control system illustrated in FIG. 1.

FIG. 5 is a simplified block diagram of an example control device 500 (e.g., a dimmer switch) that may be deployed as, for example, the dimmer switch 110 of the lighting control system 100 and/or the control device 200. The control device 500 may include a hot terminal H that may be adapted to be coupled to an AC power source 502. The control device 500 may include a controlled hot terminal CH (e.g., a switched hot and/or a dimmed hot terminal) that may be adapted to be coupled to an electrical load, such as a lighting load 504. The control device 500 may include a controllably conductive device 510 coupled in series electrical connection between the AC power source 502 and the lighting load 504. The controllably conductive device 510 may control the power delivered to the lighting load. The controllably conductive device 510 may include a relay and/or a bidirectional semiconductor switch, such as, for example, a triac, a field-effect transistor (FET) in a rectifier bridge, two FETs in anti-series connection, one or more insulated-gate bipolar junction transistors (IGBTs), or other suitable semiconductor switching circuit.

The control device 500 may include a control circuit 514. The control circuit 514 may include one or more of a processor (e.g., a microprocessor), a microcontroller, a programmable logic device (PLD), a field programmable gate array (FPGA), an application specific integrated circuit (ASIC), or any suitable controller or processing device. The control circuit 514 may be operatively coupled to a control input of the controllably conductive device 510, for example, via a gate drive circuit 512. The control circuit 514 may be used for rendering the controllably conductive device 510 conductive or non-conductive, for example, to turn the lighting load 504 on and off and/or to control the amount of power delivered to the lighting load 504.

The control circuit 514 may receive a control signal representative of the zero-crossing points of the AC main line voltage of the AC power source 502 from a zero-crossing detector 516. The control circuit 514 may be operable to render the controllably conductive device 510 conductive and/or non-conductive at predetermined times relative to the zero-crossing points of the AC waveform using a phase-control dimming technique. Examples of dimmers are described in greater detail in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSOR-CONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are hereby incorporated by reference.

The control device 500 may include a memory 518. The memory 518 may be communicatively coupled to the control circuit 514 for the storage and/or retrieval of, for example, operational settings, such as, dimming curves and/or lighting presets and associated preset light intensities. The memory 518 may be implemented as an external integrated circuit (IC) or as an internal circuit of the control circuit 514. The control device 500 may include a power supply 520. The power supply 520 may generate a direct-current (DC) supply voltage $V_{CC}$ for powering the control circuit 514 and the other low-voltage circuitry of the control device 500. The power supply 520 may be coupled in parallel with the controllably conductive device 510. The power supply 520 may be operable to conduct a charging current through the lighting load 804 to generate the DC supply voltage $V_{CC}$.

The control circuit 514 may be responsive to inputs received from one or more actuators 530 and/or first and second rotational position sensing circuits 540, 550. The control circuit 514 may control the controllably conductive device 510 to turn the lighting load 504 on and off, adjust the intensity of the lighting load, and/or adjust the color of the lighting load in response to the inputs received via the actuators 530 and/or the rotational position sensing circuits 540, 550. The actuators 530 may include a button or switch (e.g., a mechanical button or switch, or an imitation thereof) such as those described in association with the actuation portion 230 of the control device 200 and/or the actuation portion 336 of the remote control device 310. The actuators 530 may be configured to send respective input signals to the control circuit 514 in response to actuations of the actuators 530.

The first and second rotational sensing circuits 540, 550 may be configured to translate forces applied to respective rotating mechanisms (e.g., such as the rotating portions 210, 220 of the control device 200 and/or the rotating portions 332, 334 of the remote control device 310) into one or more input signals and provide the one or more input signals to the control circuit 514. Each of the rotational sensing circuits 540, 550 may include, for example, one or more magnetic sensors (e.g., such as Hall-effect sensors (HES), tunneling magnetoresistance (TMR) sensors, anisotropic magnetoresistance (AMR) sensors, giant magnetoresistance (GMR)

sensors, reed switches, or other mechanical magnetic sensors), a mechanical encoder, and/or an optical encoder.

The control device 500 may comprise a communication circuit 522. The communication circuit 522 may comprise a wireless communication circuit, such as, for example, a radio-frequency (RF) transceiver coupled to an antenna for transmitting and/or receiving RF signals, an RF transmitter for transmitting RF signals, an RF receiver for receiving RF signals, or an infrared (IR) transmitter and/or receiver for transmitting and/or receiving IR signals. The communication circuit 522 may also comprise a wired communication circuit configured to be coupled to a wired control link, for example, a digital communication link and/or an analog control link, such as a 0-10V control link or a pulse-width modulated (PWM) control link. In addition, the communication circuit 522 may be coupled to the electrical wiring between the control device 500 and the lighting load 504 and may be configured to transmit a control signal to the lighting load 504 via the electrical wiring using, for example, a power-line carrier (PLC) communication technique.

The communication circuit 522 may be configured to transmit a control signal that includes the control data (e.g., a digital message) generated by the control circuit 514 to the lighting load 504. As described herein, the control data may be generated in response to a user input to adjust one or more operational aspects of the lighting load 504. The control data may include a command and/or identification information (e.g., such as a unique identifier) associated with the control device 500. In addition to or in lieu of transmitting the control signal to the lighting load 504, the communication circuit 522 may be controlled to transmit the control signal to a central controller of the lighting control system.

The control circuit 514 may be configured to turn the lighting load on and off by rendering the controllably conductive device 510 conductive and non-conductive in response to an actuation of one of the actuators 530. The control circuit 514 may be configured to transmit digital messages to the lighting load 504 via the communication circuit 522 for adjusting the intensity of the lighting load in response to rotations of the first rotating mechanism (e.g., independently, or simultaneously with rotations of the second rotating mechanism) determined from the first rotational sensing circuit 540. In addition, the control circuit 514 may be configured to control the controllably conductive device 510 using the phase control technique to adjust the intensity of the lighting load in response to rotations of the first rotating mechanism determined from the first rotational sensing circuit 540. The control circuit 514 may be configured to transmit digital messages to the lighting load 504 via the communication circuit 522 for adjusting the color of the lighting load in response to rotations of the second rotating mechanism (e.g., independently, or simultaneously with rotations of the first rotating mechanism) determined from the second rotational sensing circuit 550.

The control circuit 514 may be configured to illuminate one or more light sources, e.g., LEDs 560, to provide feedback of a status of the lighting load 504, to indicate a status of the control device 500, and/or to assist with a control operation (e.g., to provide a color gradient for controlling the color of the lighting load 504, etc.). The control circuit 514 may be configured to illuminate one or more visual indicators, such as a light bar (e.g., the light bar 250 and/or the light bar 338), to serve as indicators of various conditions. When the first rotating mechanism is being rotated as determined from the first rotational sensing circuit 540, the control circuit 514 may control the LEDs 560 to illuminate the light bar (e.g., illuminated in a single color, such as white) to display feedback information regarding the present intensity of the lighting load 504. When the second rotating mechanism is being rotated as determined from the second rotational sensing circuit 550, the control circuit 514 may control the LEDs 560 to illuminate the light bar with one or more colors to provide feedback of the present color of the lighting load 504. When both the first and second rotating mechanisms are being rotated as determined from the first and second rotational sensing circuit 540, 550, the control circuit 514 may control the LEDs 560 to illuminate the light bar to provide feedback of the present intensity and/or color of the lighting load 504.

Figure 6:
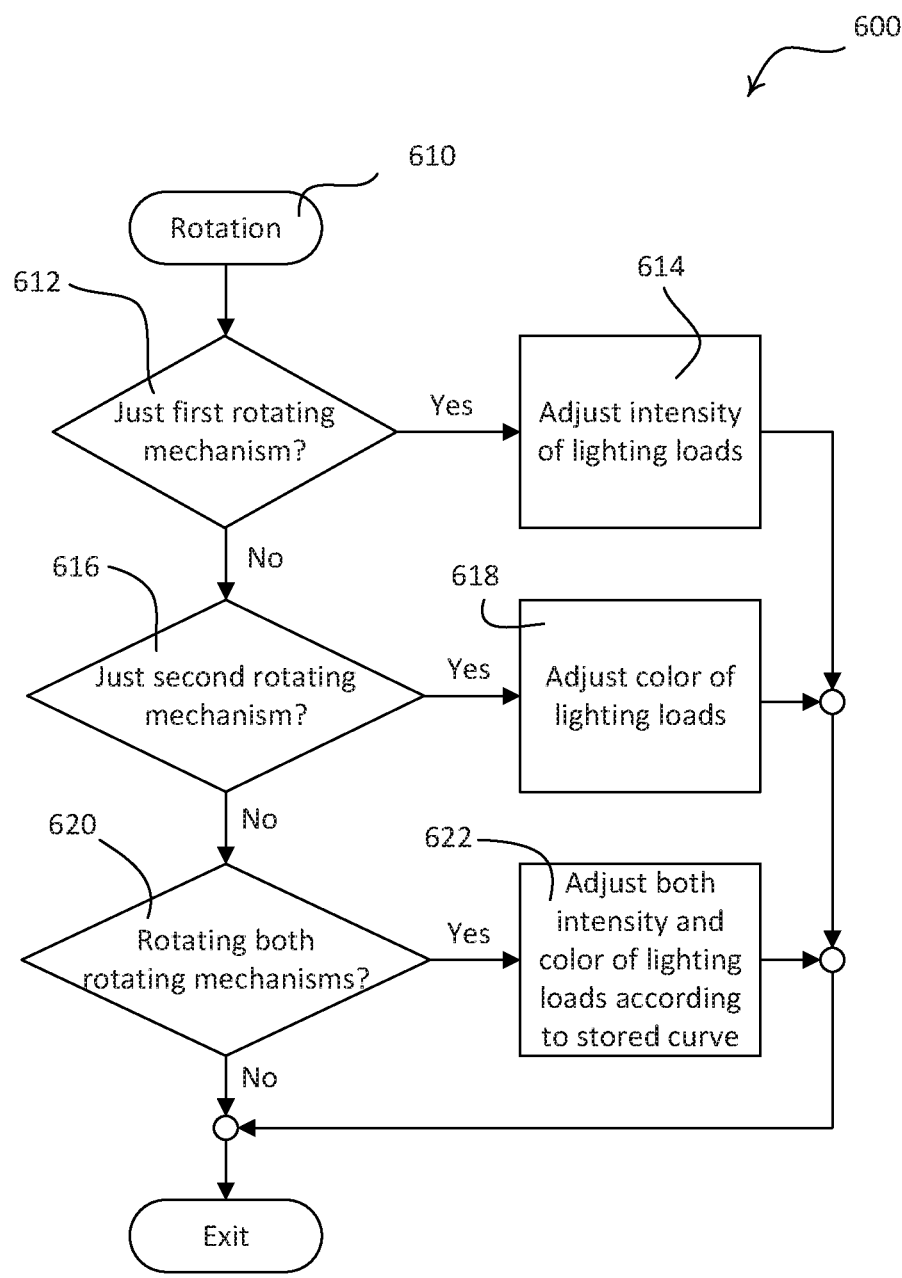
FIG. 6 shows an example intensity and/or color control procedure that may be executed by the control devices of the load control system illustrated in FIG. 1.

FIG. 6 shows a simplified flowchart of an example control procedure 600 that may be executed by a control circuit of a control device (e.g., the control circuit 430 of the control device 400 and/or the control circuit 514 of the control device 500) for controlling multiple characteristics of one or more electrical loads, such as a lighting load. The control procedure 600 may begin at 610 when rotation of either of first and second rotating mechanisms (e.g., the first and second rotating portions 210, 220 of the control device 200 and/or the rotating portion 332, 334 of the remote control device 310) is detected. If just the first rotating mechanism is being rotated at 612, the control circuit may adjust the intensity of the lighting load (e.g., by directly controlling a controllably conductive device and/or by transmitting one or more digital messages) at 614, before the control procedure 600 exits. If just the second rotating mechanism is being rotated at 616, the control circuit may adjust the color of the lighting load (e.g., by directly controlling a controllably conductive device and/or by transmitting one or more digital messages) at 618, before the control procedure 600 exits. If both of the first and second rotating mechanisms are being rotated at 620, the control circuit may adjust both the intensity and the color of the lighting load according to a predetermined dimming curve (e.g., a dim-to-warm dimming curve) at 622, before the control procedure 600 exits.

What is claimed is:

1. A control device configured for use in a load control system to control one or more electrical loads external to the control device, the control device comprising:
   a base portion; and
   a control unit configured to be coupled to the base portion, the control unit comprising:
   a first rotating portion configured to be rotatable with respect to the base portion;
   a second rotating portion concentric with the first rotating portion and configured to be rotatable with respect to the base portion, wherein the first and second rotating portions define outer surfaces of the control unit, and wherein the first and second rotating portions have the same outer diameter;
   an actuation portion surrounded by at least one of the first or second rotating portions; and
   a control circuit configured to generate first control data for changing a first characteristic of the one or more electrical loads in response to the first rotating portion being rotated by a user, the control circuit configured to generate second control data for changing a second characteristic of the one or more electrical loads in response to the second rotating portion being rotated by the user, the control circuit further configured to generate third control data for toggling the one or more electrical loads between on and off in response to the actuation portion being pressed in towards the base portion by the user.

2. The control device of claim 1, wherein the first rotating portion is configured as a front ring and the second rotating portion is configured as a rear ring, the control circuit configured to generate the first control data for adjusting an intensity of the one or more electrical loads in response to the first rotating portion being rotated by the user, the control circuit further configured to generate the second control data for changing a color of the one or more electrical loads in response to the second rotating portion being rotated by the user.

3. The control device of claim 2, further comprising:
one or more visual indicators configured to be illuminated by one or more light sources.

4. The control device of claim 3, wherein, when the first rotating portion is being rotated to adjust the intensity of the one or more electrical loads, the control circuit is configured to illuminate the one or more visual indicators to display feedback information regarding a present intensity of the one or more electrical loads.

5. The control device of claim 3, wherein, when the second rotating portion is being rotated to adjust the color of the one or more electrical loads, the control circuit is configured to illuminate the one or more visual indicators to display feedback information regarding a present color of the one or more electrical loads.

6. The control device of claim 3, wherein, when the first and second rotating portions are being rotated together to adjust both the intensity and the color of the one or more electrical loads, the control circuit is configured to illuminate the one or more visual indicators to display feedback information regarding a present intensity of the one or more electrical loads.

7. The control device of claim 3, wherein the one or more visual indicators comprise a light bar.

8. The control device of claim 7, wherein the light bar is substantially circular and extends along a perimeter of the first rotating portion.

9. The control device of claim 1, wherein the first and second rotating portions are independently rotatable.

10. The control device of claim 1, wherein the first and second rotating portions are simultaneously rotatable, and wherein the control circuit is configured to generate the first control data and the second control data according to a predetermined dimming curve when the first and second rotating portions are simultaneously rotated by the user, the predetermined dimming curve defining a relationship between an intensity and a color of the one or more electrical loads.

11. The control device of claim 1, wherein the control unit further comprises:
a communication circuit configured to transmit a first control signal associated with the first control data and a second control signal associated with the second control data; and
a battery configured to provide power to the control circuit and the communication circuit.

12. The control device of claim 11, wherein the first and second rotating portions surround the control circuit, the communication circuit, and the battery.

13. The control device of claim 1, wherein the control device is configured to be mounted over a toggle actuator of the mechanical switch that controls whether power is delivered to the one or more electrical loads.

14. The control device of claim 1, wherein the first rotating portion is arranged as a front ring, and the second rotating portion is arranged as a rear ring that is configured to be closer to the base portion than the first rotating portion when the control unit is coupled to the base portion.

15. A control device configured for use in a load control system to control one or more electrical loads external to the control device, the control device comprising:
a front ring and a rear ring along an axis perpendicular to a front surface of the control device, the rear ring being concentric to the front ring, the front ring and the rear ring configured to be rotatable around the axis, wherein the front and rear rings have the same outer diameter;
an actuation portion surrounded by the front ring; and
a control circuit configured to generate first control data for changing an intensity of the one or more electrical loads in response to the front ring being rotated by a user, the control circuit configured to generate second control data for changing a color of the one or more electrical loads in response to the rear ring being rotated by the user, the control circuit further configured to generate third control data for toggling the one or more electrical loads between on and off in response to the actuation portion being pressed in along the axis perpendicular to the front surface of the control device by the user.

16. The control device of claim 15, further comprising:
one or more visual indicators configured to be illuminated by one or more light sources;
wherein, when the front ring is being rotated to adjust the intensity of the one or more electrical loads, the control circuit is configured to illuminate the one or more visual indicators to display feedback information regarding a present intensity of the one or more electrical loads; and
when the rear ring is being rotated to adjust the color of the one or more electrical loads, the control circuit is configured to illuminate the one or more visual indicators to display feedback information regarding a present color of the one or more electrical loads.

17. The control device of claim 16, wherein the front ring and the rear ring are simultaneously rotatable to adjust both the intensity and the color of the one or more electrical loads, and wherein, when the front and rear rings are being rotated together by the user to adjust both the intensity and the color of the one or more electrical loads, the control circuit is configured to illuminate the one or more visual indicators to display feedback information regarding the present intensity of the one or more electrical loads.

18. The control device of claim 15, further comprising:
a communication circuit configured to transmit a first control signal associated with the first control data and a second control signal associated with the second control data.

19. The control device of claim 15, further comprising:
a base portion configured to be mounted over a toggle actuator of a mechanical switch that controls whether power is delivered to the one or more electrical loads;
wherein the control device further comprises a control unit that is configured to be coupled to the base portion, the control unit comprising a battery for powering the control circuit of the control device, and comprising the front ring, the rear ring, the actuation portion, and the control circuit of the control device, wherein the front and rear rings surround the control unit.

20. The control device of claim 15, further comprising:
a base portion that is configured to be mounted to a standard electrical wallbox, such that, once mounted, the control device may be coupled in series electrical connection between an alternating-current (AC) power source and the one or more electrical loads for controlling power delivered to the one or more electrical loads.

* * * * *